United States Patent [19]

Conley

[11] Patent Number: 5,510,665
[45] Date of Patent: * Apr. 23, 1996

[54] OPTOELECTRONIC ACTIVE CIRCUIT ELEMENT

[75] Inventor: Jerry J. Conley, Waseca, Minn.

[73] Assignee: E. F. Johnson Company, Waseca, Minn.

[*] Notice: The portion of the term of this patent subsequent to Jun. 23, 2009, has been disclaimed.

[21] Appl. No.: 40,897

[22] Filed: Jun. 28, 1993

Related U.S. Application Data

[60] Division of Ser. No. 578,000, Sep. 4, 1990, Pat. No. 5,237,233, which is a continuation-in-part of Ser. No. 318,743, Mar. 3, 1989, Pat. No. 5,008,579.

[51] Int. Cl.⁶ ............ G21H 1/12; H01L 31/06; G03H 1/02
[52] U.S. Cl. ............ 310/303; 359/39; 136/253
[58] Field of Search ............ 310/301, 303; 359/39, 244, 299; 250/208.4, 208.6; 136/253, 254

[56] References Cited

U.S. PATENT DOCUMENTS

| 3,053,927 | 9/1962 | Viszlocky | 310/301 |
| 4,242,147 | 12/1980 | DeToia | 136/253 |
| 4,628,143 | 12/1986 | Brotz | 310/303 |
| 4,767,195 | 8/1988 | Pepper | 359/39 |
| 5,082,505 | 1/1992 | Cota et al. | 136/253 |
| 5,115,336 | 5/1992 | Schildkraut et al. | 359/263 |
| 5,124,610 | 7/1992 | Conley et al. | 310/303 |

*Primary Examiner*—Nelson Moskowitz
*Attorney, Agent, or Firm*—Patterson & Keough

[57] ABSTRACT

An optoelectronic active circuit element is created by the combination of a light source, an optical control filter and a photocell intimately coupled together. The light source has at least one light emitting surface emitting light energy of a specified frequency bandwidth and the photocell has at least one light absorbing surface for receiving the emitted light energy. The optical control filter includes a photorefractive material responsive to an input signal. The optical control filter may also include a polarization filter. The optoelectronic active circuit element modulates the amplitude, frequency or both of the emitted light energy in response to the input signal to produce a characteristic function of the output of the device that is similar to that of a traditional active circuit element, as well as many variations on that function.

15 Claims, 8 Drawing Sheets

Fig. 7a $$\left[ I_0(0^{\frac{qv}{AKT}} - 1) \right]$$

Fig. 7b $$I = I_0 \left\{ \exp\left[\frac{q}{AKT}(V \div IR_s)\right] - 1 \right\} + \frac{V}{R_{sh}} - I_L \quad \ldots\ldots(1)$$

Fig. 7c $$I_L = q \int^\infty N(\lambda)\cdot\gamma(\lambda)\, d\lambda = \frac{q}{hc} \int^\infty P_{in}(\lambda)\cdot\gamma(\lambda)\cdot\lambda\, d\lambda$$

Fig. 7d $$P_{in} = \int^\infty P_{in}(\lambda)\, d\lambda = \int N(\lambda)\cdot\frac{hc}{\lambda}\, d\lambda$$

| TRANSPARENT CONDUCTIVE OXIDE | .07 MICRON |
|---|---|
| p+a-SiC | .05 MICRON |
| INTRINSIC a-Si | .5 - .6 MICRON |
| n+ MICROCRYSTALLINE SILICON | .02 MICRON |
| TRANSPARENT DIFFUSION BARRIER | .01 MICRON |
| ALUMINUM | .3 MICRON |
| BONDING LAYER | .05 MICRON |
| POLYIMIDE | 50 MICRON |

OPTOELECTRONIC ACTIVE CIRCUIT ELEMENT

RELATED APPLICATION

This is a divisional of application Ser. No. 578,000, filed Sep. 1, 1990, now U.S. Pat. No. 5,237,233, which is a continuation-in-part of a prior application Ser. No. 318,743, filed on Mar. 3, 1989 of Jerry J. Conley, et al. for LIGHT EMITTING POLYMER ELECTRICAL ENERGY SOURCE now issued as U.S. Pat. No. 5,008,579.

TECHNICAL FIELD

The present invention pertains to the field of optoelectronic devices. In particular, this invention pertains to an optoelectronic element comprised of a light source means, an optical control means and a photocell means intimately coupled together so that the optoelectronic element behaves like an active circuit element, such as a transistor or a diode.

BACKGROUND ART

It is well known that optical energy can be absorbed in a semiconductor material if the photon energy is greater than the band-gap energy of the semiconductor material. This phenomenon, known as the photovoltaic or photoconductive effect, occurs when the photons absorbed by the semiconductor material generate electron-hole pairs that produce a potential difference or increased conductance across the p-n junction of the semiconductor. The phenomenon has been used in the prior art to create a variety of hybrid optical/electrical devices. For a more detailed explanation of this phenomenon and its application, reference is made to J. Wilson and J. Hawkes, *Optoelectronics: An Introduction*, pgs. 286–327, Prentice Hall (1983).

Most well known among the uses of the photovolatic/photoconductive effect is the use of a photodiode for generating electrical power, e.g., solar cells converting sunlight to electricity. Other variations of the basic photodiode include the avalanche photodiode and the phototransistor, both of which internally amplify the current flow across the p-n junction of the photodiode. The photodiode is also used as a photodetector for detecting the presence or absence of optical energy, e.g. the light beam switch in an elevator door or a photochopper wheel. Optoisolators make use of the photodiode and a photoemmissive device (e.g., a light emitting diode or LED) to convert electrical energy to photon energy and back again for the purpose of decoupling a power source or an electrical signal. For example, U.S. Pat. No. 4,695,120 shows the combined use of optoisolators to electrically isolate all of the signals to an integrated circuit and a photodiode to provide the electrical power for the integrated circuit. A detailed description of the various types of optoelectronic devices that are available in the prior art is provided in *Optoelectronics Fiber-Optic Applications Manual*, Hewlett Packard (1981), and *Optoelectronics: Theory and Practice*, Texas Instruments (1978).

Another phenomenon that has been put to use in optical and hybrid optical/electrical circuit devices is the atomic level relationship between electrical fields and optical transmisivity, sometimes referred to as photorefractivity. Photorefractive substances exhibit a change in their index of refraction in response to the application of an electrical field. The most well known of photorefractive materials is the liquid crystal display or LCD. For a more detailed explanation of this phenomenon and its application, reference is made to *Photorefractive Materials and Their Applications*, Topics in Applied Physics, Vols. 61 and 62, Gunter, P. and Huignard, J. (eds.) (1989).

For purposes of understanding the wide variety of electrical/optical devices that are available in the prior art with respect to the present invention, it is helpful to categorize present hybrid electrical/optical circuit devises based upon the nature of their inputs and outputs. Primary electrical/optical devices convert photon energy (input) to electrical energy (output) or vice-versa. Examples of primary types of hybrid electrical/optical devices include the photodiode (optical input/electrical output), the light emitting diode (electrical input/optical output) and the semiconductor laser (electrical input/optical output). Intermediary or secondary electrical/optical devices have a common input and output, but use either photon energy or electrical energy as part of an intermediary step internal to the device. Examples of intermediary or secondary types of hybrid electrical/optical devices include solid state image intensifiers and electroluminiscient devices (optical input/output, electrical intermediary) and photoisolators and optocouplers (electrical input/output, optical intermediary).

Of interest for purposes of the present invention are those secondary or intermediary hybrid electrical/optical devices that utilize photorefractive materials as part of the intermediary step. Prior art application of photorefractive materials to hybrid electrical/optical devices has been limited to secondary devices having optical inputs and outputs with an electrical intermediary. The most prevalent uses of photorefractive materials include optical amplifiers, waveguides and light valves, such as liquid crystal light valves, which are used as part of an optical computing network. For example, U.S. Pat. No. 4,764,889 describes the use of optically nonlinear self electro-optic effect devices as part of an optical logical arrangement. U.S. Pat. No. 4,818,867 describes the use of an optical shutter on the output of an optical logic element. An overview of the various types of hybrid electrical/optical devices used in connection with prior art optical computing networks is provided in Feitelson, D., *Optical Computing* (1988).

Although the use of photorefractive materials is well known as part of the intermediary step for electrical/optical hybrid devices having optical inputs and outputs with an electrical intermediary, photorefractive materials have not been used in connection with other types of electrical/optical hybrid devices having electrical inputs and outputs with an optical intermediary. The optical intermediaries of photoisolators and optocouplers are designed for the optimum transfer of photon energy between the photoemissive device and the photovoltaic/photoconductive element and, hence, there is no need for intermediary optical control in such devices. Accordingly, it would be desirable to provide an optoelectronic device that makes use of photorefractive materials as part of an optical intermediary for electrical/optical hybrid devices having electrical inputs and outputs that could take advantage of a modulated transfer function of the photon energy in such a device.

SUMMARY OF THE INVENTION

In accordance with the present invention, an optoelectronic active circuit element is comprised of a light source means, a photocell means and an optical control means. The light source means has at least one light emitting surface for emitting light energy in a specified frequency bandwidth and the photocell means also has at least one light collecting surface for absorbing light energy. The optical control means is intimately interposed between the light emitting surface of the light source means and the light collecting surface of the photocell means for controlling the emitted light energy that may be absorbed by the photocell means in response to an input signal.

The light optical means is capable of either frequency or amplitude modulation of the emitted light energy as a result of changes in the indices of refraction and/or polarization of a photorefractive material. In the preferred embodiment, the photorefractive material is a liquid crystal display material or a lead lantium zirconium titinate material capable of fast switching speeds in response to small changes in an electrical input signal.

In the preferred embodiment of the present invention, the light source means is self-powered by the use of a light emitting polymer as the light source means. The light emitting polymer is comprised of a tritiated organic polymer to which at least one organic phosphor or scintillant is bonded. Because the electrical energy generated by the preferred embodiment is dependent upon the rate of emission of photons from the light emitting polymer (which is in turn dependent upon the rate of beta-emissions from the radioisotope used to activate the light emitting polymer), the amount of photon energy available is essentially constant and determinable and is isolated from any electrical noise in the system. In addition to providing a unique source of electrical energy, as well as electrical signals, for CMOS, NMOS and other low power types of electronic circuitry, the output stability and isolation of the present invention makes it ideally suited for applications that require a voltage or current sources that have high signal to noise ratios.

Accordingly, a primary objective of the present invention is to provide an optoelectronic active circuit element that includes an optical control means for controlling the amount of electrical energy generated by a photovoltaic cell by controlling the amount of light that is received by a photovoltaic cell from a light source.

Another objective of the present invention is to provide an optoelectronic device that makes use of photorefractive materials as part of an optical intermediary for electrical/optical hybrid devices having electrical inputs and outputs and takes advantage of a modulated transfer function of the photon energy in such a device.

A further objective of the present invention is to provide an optoelectronic active circuit element wherein the light source means is self-powered by the use of a light emitting polymer as the light source means.

Still another objective of the present invention is to provide an optoelectronic active circuit element that includes an optical control means capable of both amplitude and frequency modulation of the photon energy transmitted through the optical control means.

A still further objective of the present invention is to provide an optoelectronic active circuit element having an optical control means comprised of an interference filter means and a photorefractive material in combination.

These and other objectives of the present invention will become apparent with reference to the drawings, the detailed description of the preferred embodiment and the appended claims.

DESCRIPTION OF THE PREFERRED EMBODIMENT

Figure 1:
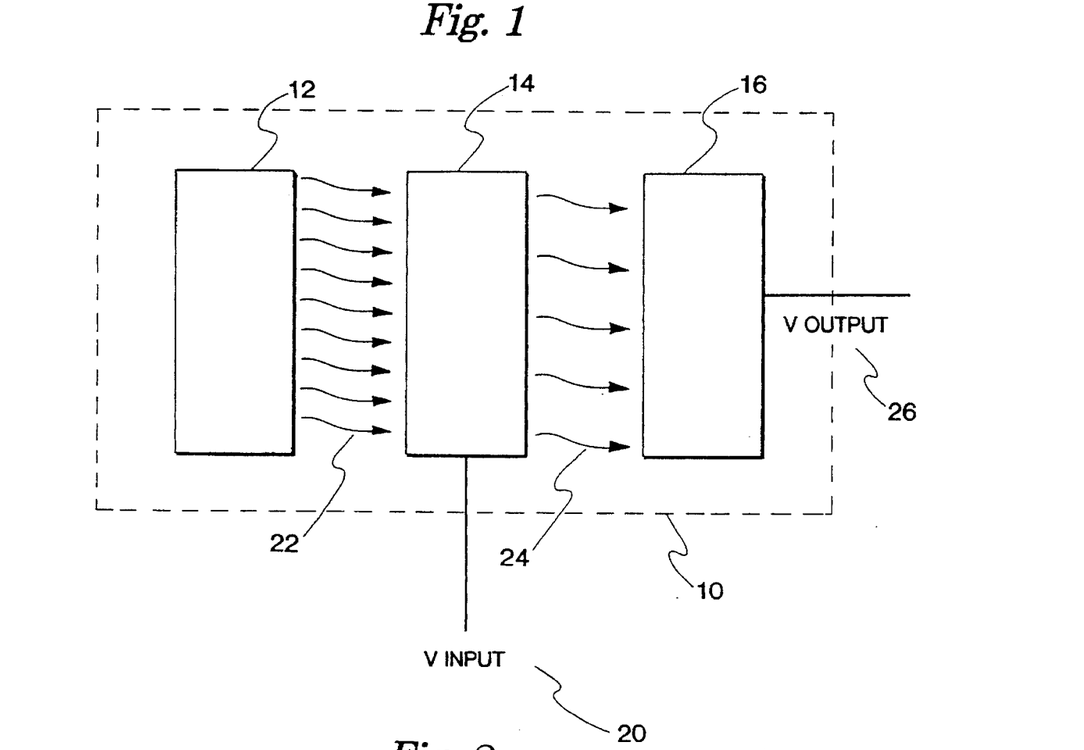
FIG. 1 is a schematic view of the preferred embodiment of the present invention.

Referring to FIG. 1, the preferred embodiment of the present invention will be described. An optoelectronic active circuit element 10 in accordance with the present invention comprises a light source means 12, an optical control means 14 and a photocell means 16. The optical control means 14 is a photorefractive material that is intimately interposed between a light emitting surface of the light source means 12 and a light receiving surface of the photocell means 16. Unlike the prior art secondary or intermediary electrical/optical hybrid devices having optical inputs and outputs with an electrical intermediary, the optoelectronic active circuit element 10 of the present invention is an electrical/optical hybrid device that has an electrical input 20 and an electrical output 22 with an optical intermediary in the form of light source means 12 and optical control means 14. Also, unlike the prior art photodetectors and photochoppers, the optoelectronic active circuit element 10 of the present invention is capable of emulating a traditional active circuit element (i.e., a transistor or a diode) by operating in the active range of an I-V curve.

The optoelectronic active circuit element 10 operates as an active circuit element by providing an input voltage $V_{input}$ 20 that controls the transmissivity of the optical control means 14. As a result, the photons 22 emitted by the light emitting surface of the light source means 12 are modulated before striking the light receiving surface of the photocell means 16. In the embodiment as shown in FIG. 1, the photons 22 are amplitude modulated to decrease the number of photons 24 that are allowed to pass through to the light receiving surface of the photocell means 16. In an alternative embodiment described in greater detail hereinafter, the photons 22 may also be frequency modulated by the optical control means 14 to produce the desired effect of the optoelectronic active circuit element 10. The photons 24 striking the light receiving surface of the photocell means 16, in this case a photovoltaic cell, generate an open circuit voltage $V_{output}$ that is dependent upon the frequency and intensity of the photon energy absorbed by the photo detector means 16. As such, the optoelectronic active circuit element 10 behaves like a traditional active circuit element (i.e., a triode vacuum tube, a transistor or a diode) in that the output voltage or current is a function of the input voltage or current. Unlike conventional semiconductor transistors or diodes, the optoelectronic active circuit element 10 exhibits the characteristic of a vacuum tube in that the energy source can be completely independent from the input voltage or current. This isolation of the input signal from the energy source results in a favorable signal-to-noise ratio (SNR) for the optoelectronic active circuit element 10 of the present invention.

Self-Powered Active Circuit Element

Figure 2:
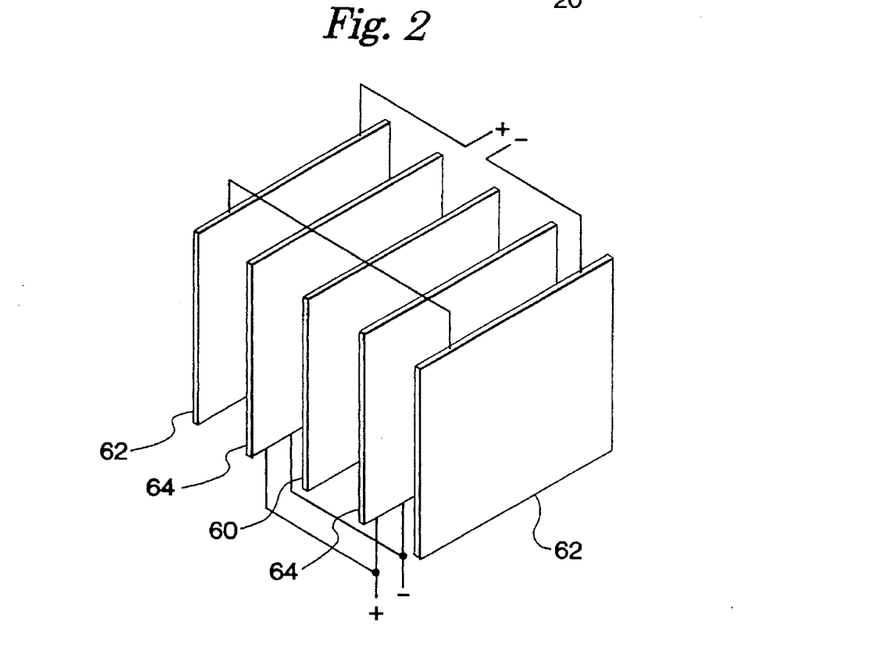
FIG. 2 is a schematic view of the present invention including an optical control means.

In the preferred embodiment of the present invention shown in FIG. 2 and described in the previously identified parent application entitled LIGHT EMITTING POLYMER ELECTRICAL ENERGY SOURCE, the light source means 12 is a light emitting polymer (LEP) material 60 and the photocell means 16 are photovoltaic cells 62. By using the LEP material 60, the preferred embodiment of the present is self-powered in that the energy for the light source means 12 is contained within the light source itself. The LEP material 60 is optically separated from the photovoltaic cells 62 by an optical control means 64 for controlling the amount of light that may be absorbed by the photovoltaic cells 62. The optical control means 64 is a photorefractive material, such as a liquid crystal display (LCD) or lead lantium zirconium titinate (PLZT) or similar material, that is either transparent or opaque, depending upon the voltage or current applied to the material. By controlling the amount of light that may be absorbed by the photovoltaic cells 62, the optical control means 64 also controls the output of the photovoltaic cells 62 and, hence, operates as either a voltage or current regulator depending upon the particular circuit that utilizes the electrical energy source of the present invention.

In the preferred embodiment, the LEP material 60 is a tritiated organic polymer to which an organic phosphor or scintillant is bonded. Such an LEP material was obtained from Amersham International plc, Amersham Place, Little Chalfont, Buckinghamshire, England, and, pending NRC regulatory approval, may be available from Amersham International plc. Such an LEP material is described in the United Kingdom patent application, Ser. No. 890,5297.1 by Colin D. Bell, entitled TRITIATED LIGHT EMITrING POLYMER COMPOSITION, filed in the British Patent Office on Mar. 8, 1989, the disclosure of which is hereby incorporated by reference herein. It should be recognized that other types of LEP material known in the prior art may also be utilized with the present invention. (e.g., U.S. Pat. Nos. 3,033,797, 3,325,420 and 3,342,743). Those aspects of the LEP material 60 that allow it to be used effectively in the present invention are discussed in greater detail in the previously identified parent application.

Light Source Means

Although the preferred embodiment of the light source means 12 is described in terms of the LEP material 60, it will be recognized that a variety of light sources are contemplated for use with the present invention. For example, the light source means 12 might be comprised of a light emitting diode or a semiconductor laser powered by an external power supply. Another variation on the self-powered aspect of the LEP material 60 is to provide a chemoluminiscient material that would be activated to operate the optoelectronic active circuit element 10 for a short period of time, for example, as an emergency transmitter. As discussed in greater detail hereinafter, the frequency bandwidth of the emitted light energy may also be used by the present invention, both in terms of its effect on the efficiency of the present invention and on the modulation of the photon energy by the optical control means 14.

The preferred embodiment of the light source means 12 is described in terms of a light source having at least one light emitting surface. As will be appreciated by a person skilled in the art, the preferred embodiment of the present invention is well-suited for the type of planar construction techniques used with integrated circuits. The materials of the preferred embodiment are capable of being integrated using well-known deposition and sputtering techniques for constructing the integral combination of the LEP material 60, the photocell 62 and the photorefractive material 64. These techniques allow the optoelectronic active circuit element 10 to be miniaturized. It will also be seen that this embodiment of the present invention may be incorporated with traditional semiconductor integrated circuit devices. Although the preferred embodiment of the light source means 12 utilizes a planar light emitting surface, other shapes and configurations of light source may also be within the scope of the present invention. For example, the LEP material 60 may be cast as an entire volume about the combination of one or more photovoltaic cells 62 having a photorefractive optical control means 64 sputtered thereon. Alternatively, the light source may be optical intimate, but physically remote from the optical control means, provided that there is suitable optical mating means (e.g., bundled optical fibers, light pipes or light channels) to transport the known photon energy from the light source to the optical control means.

Photocell Means

In the preferred embodiment as described in the previously identified parent application, the photovoltaic cells 62 are amorphous thin-film silicon solar cells, Model No. 035-01581-01, available from ARCO Solar, Inc., Chatsworth, Calif., or their equivalent. These cells have their highest efficiency conversion (greater than 20%) in the blue range of the spectrum of visible light to match the frequency bandwidth of the emitted light of LEP material incorporating a phosphor that emits in the blue range. While the particular photovoltaic cells 62 in the preferred embodiment have been selected to match the blue range of the spectrum of visible light, it should be apparent that other photovoltaic cells may be selected to match the bandwidth of light emitted at other frequencies. In particular, as discussed below, it is known that a new solar cell, known as the Sunceram II (trademark), available from Panasonic's Industrial Battery Sales Div., is claimed to more efficient than conventional amorphous silicon solar cells, especially in the red range of the spectrum of visible light.

Figure 6:
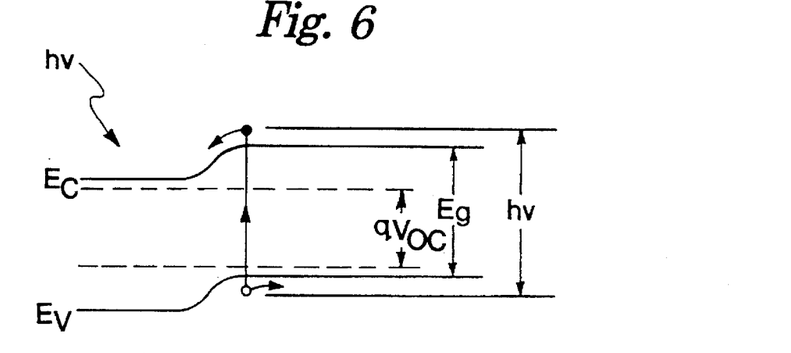
FIG. 6 is a schematic representation of a p-n photovoltaic cell.
Figure 7A:
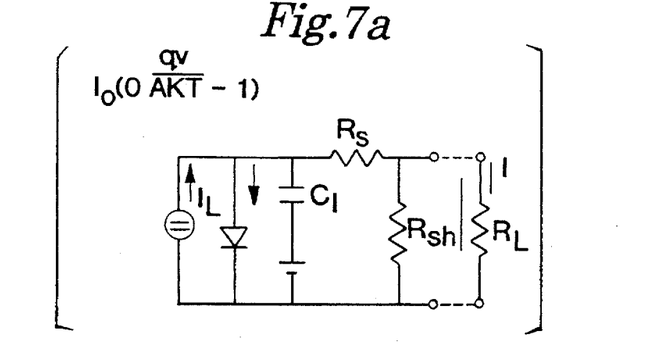
FIG. 7 shows an equivalent circuit and characteristic equations for the p-n photovoltaic cell of FIG. 6.
Figure 7B:
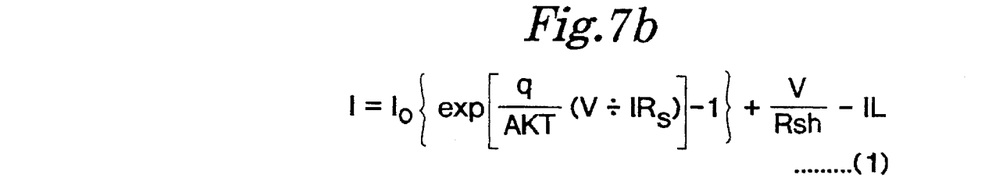
Figure 7C:
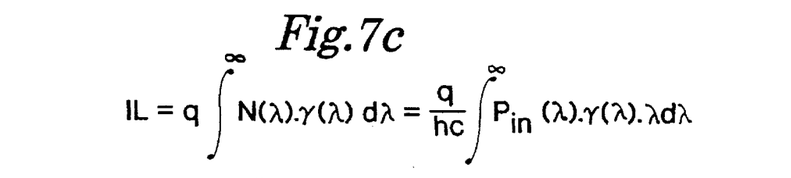
Figure 7D:
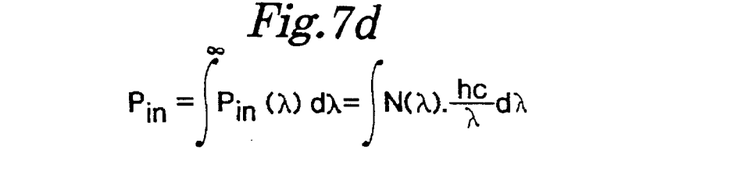

A standard type of photovoltaic cell having a p-n junction is shown in FIG. 6. An incoming photon of energy hv creates an electron-hole pair and the junction field accelerates the electron toward the n-side of the junction and the hole toward the p-side of the junction. The separation of charge leads to a voltage across the junction, the maximum value of which is $V_{oc}$. The ideal bandgap energy $E_g$ for a given photon energy should be one which is just a few tenths of an eV below the photon energy. Because the absorption coefficient for the photon increases as the photon energy increases above $E_g$, the photon energy should be somewhat greater than $E_g$ to obtain good absorption of the photons.

Referring to FIG. 7, an equivalent circuit for a photovoltaic cell and the diode equation which describes the operation of the photovoltaic cell are shown. As can be seen from the descriptive equation in FIG. 7, the current in the photovolatic cell at the operating point is the difference between the light generated current and oppositely direct currents because of diode currents and shunt currents. Clearly, the photovolatic cell will perform most efficiently when these oppositely-directed currents are minimized. This is especially important for the small light-generated currents that are experienced at low light intensities. Using the photovoltaic cell descriptive equation with the assumed diode parameters, the equation can be solved for the maximum power point parameters. This solution should yield an upper limit for the efficient of the photovoltaic cell with the given operating parameters.

Figure 8:
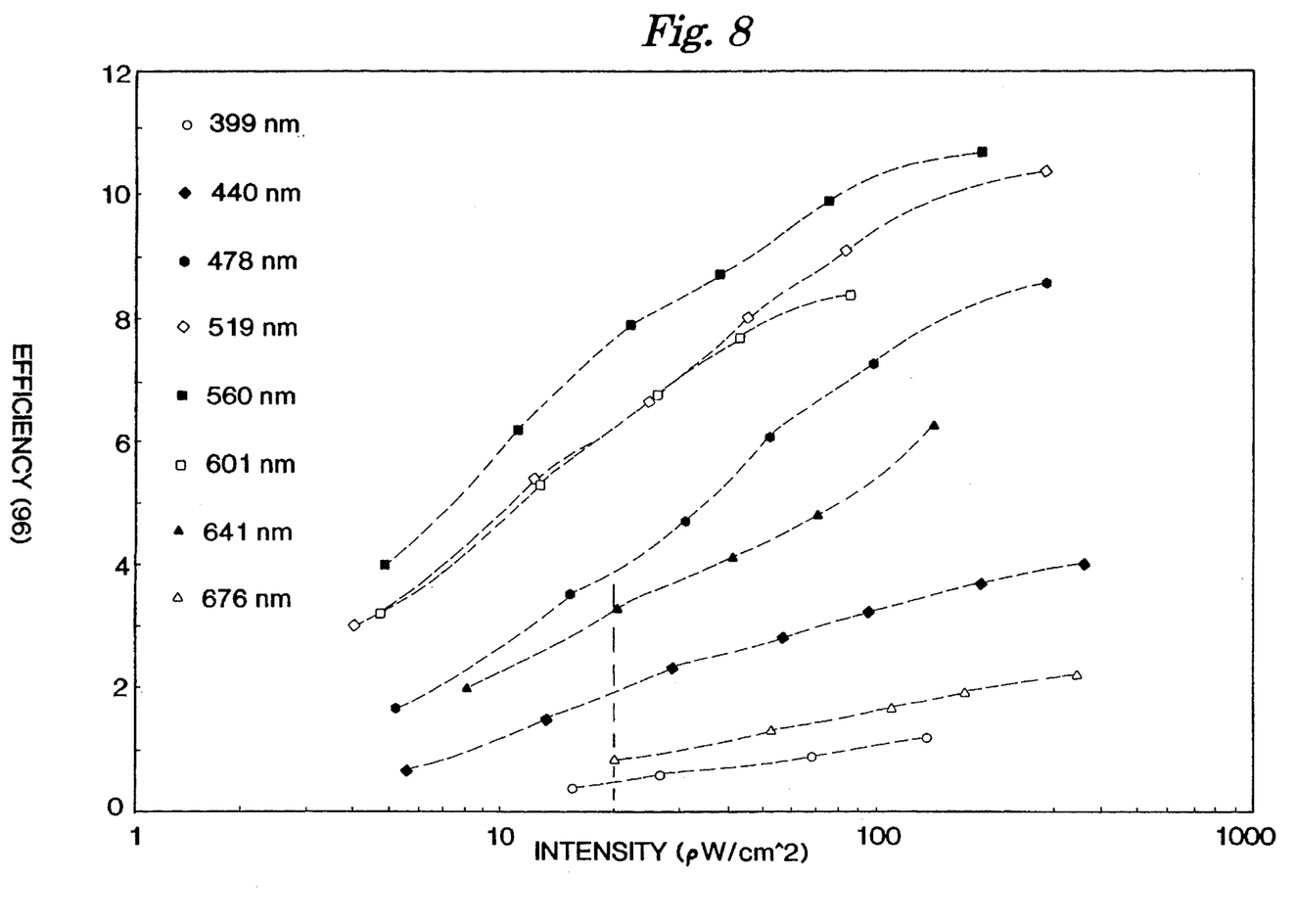
FIG. 8 is a plot of the spectral efficiency vs. the intensity for the p-n photovoltaic cell of FIG. 6.
Figure 9:
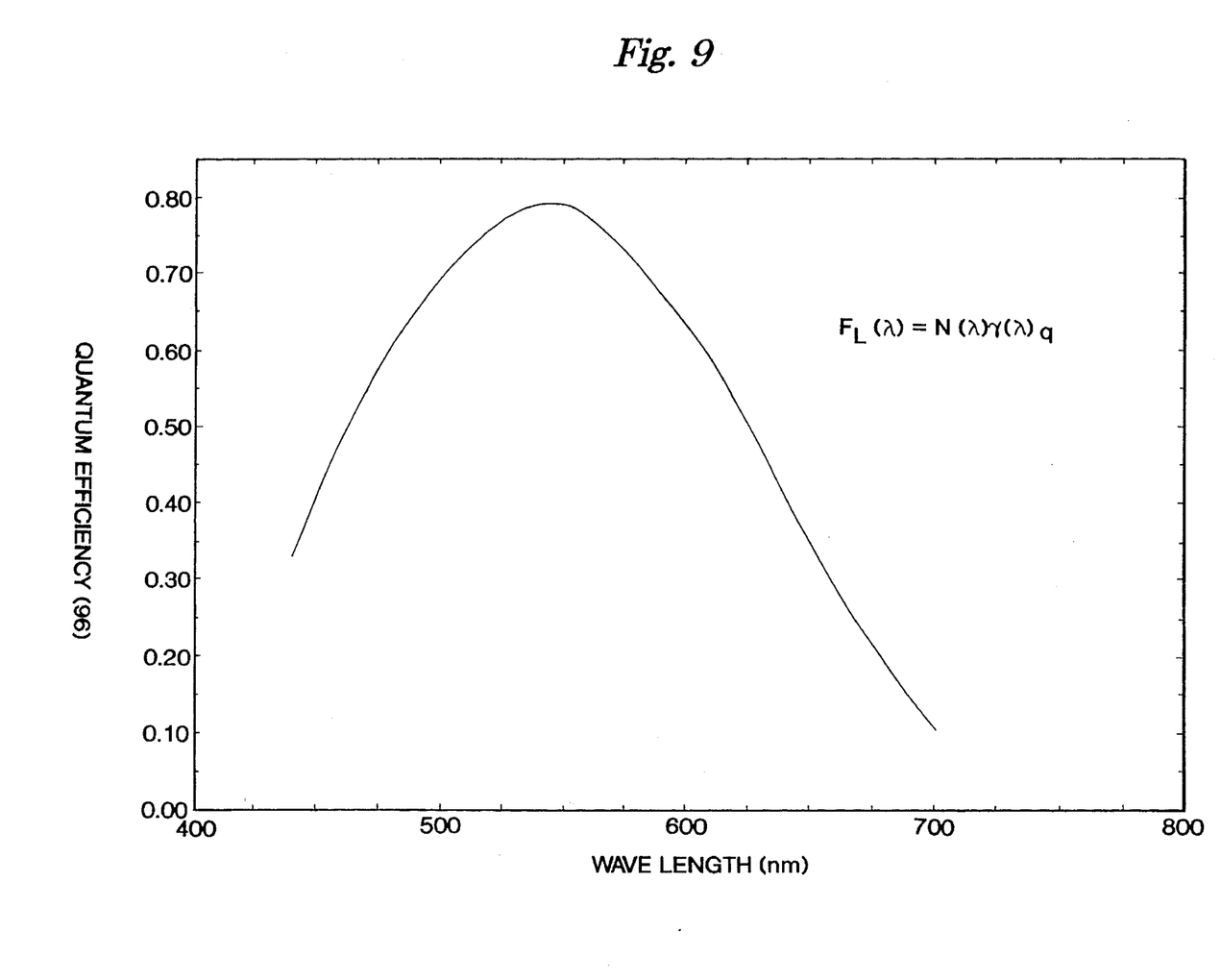
FIG. 9 is a plot of the quantum efficiency vs. wavelength for the p-n photovoltaic cell of FIG. 6.

With the considerations understood, one embodiment of photocell mans 16 of the present invention is an amorphous silicon photovoltaic cell comprised of an intrinsic layer sandwiched between a p-layer and an n-layer. The emitted light energy enters through the p-layer. The entire photovoltaic cell is sandwiched between two conductive layers, one of which is transparent and forms the light absorbing surface of the photocell means 16. A ¼"×½" amorphous silicon cell was constructed and I-V curves were measured for a number of intensities at different wavelengths. The results of these measurements are shown in FIG. 8. From the I-V curves in FIG. 8, the quantum efficiency of the photovoltaic cell is plotted as a function of wavelength as shown in FIG. 9. Given the curve of FIG. 9, the cell current density $J_L$ can be integrated to predict a total short circuit current for a given intensity of each of the desired spectra.

Figure 10:
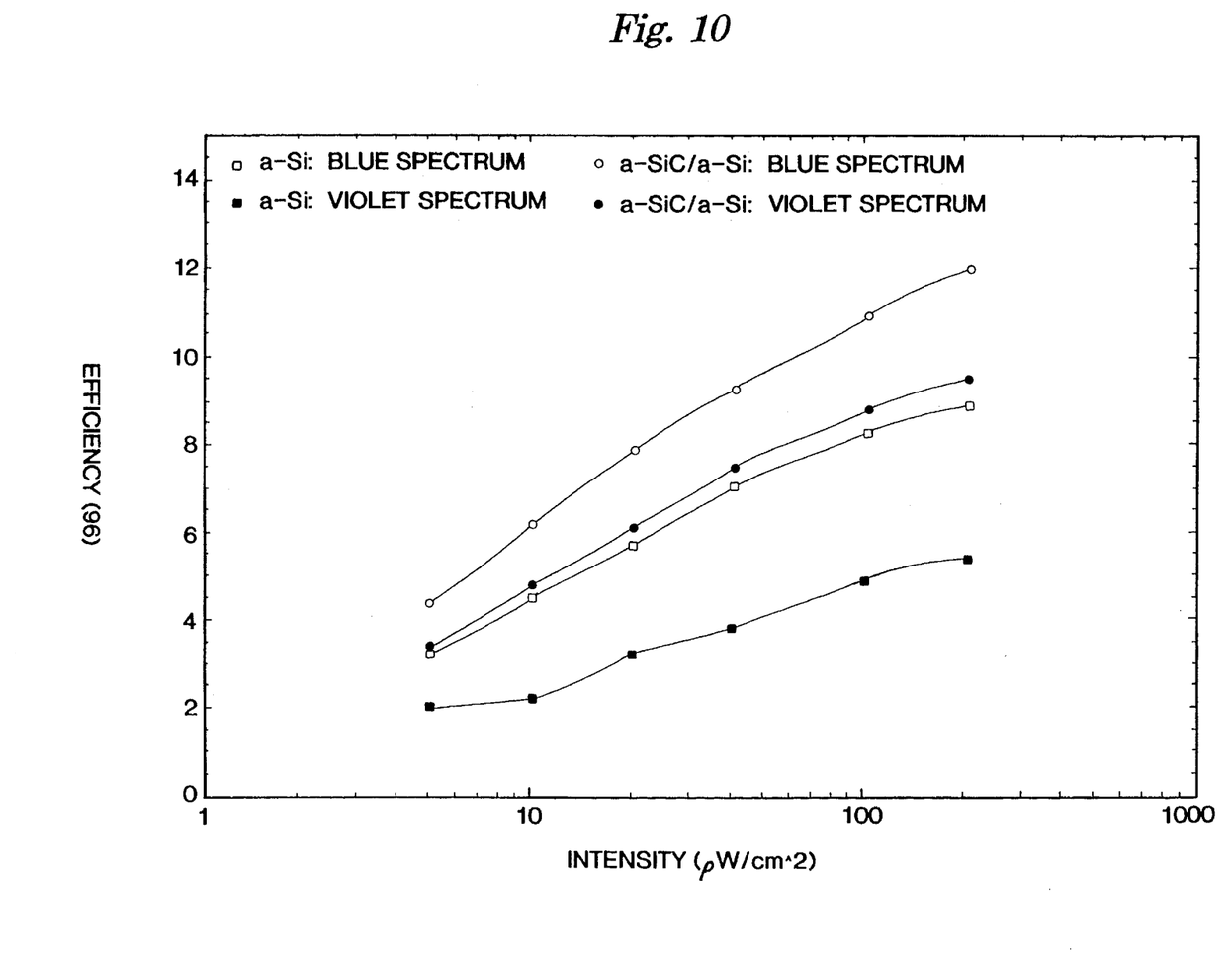
FIG. 10 is a plot of the efficient vs. intensity for two photovoltaic cells in accordance with the preferred embodiment.
Figure 11:
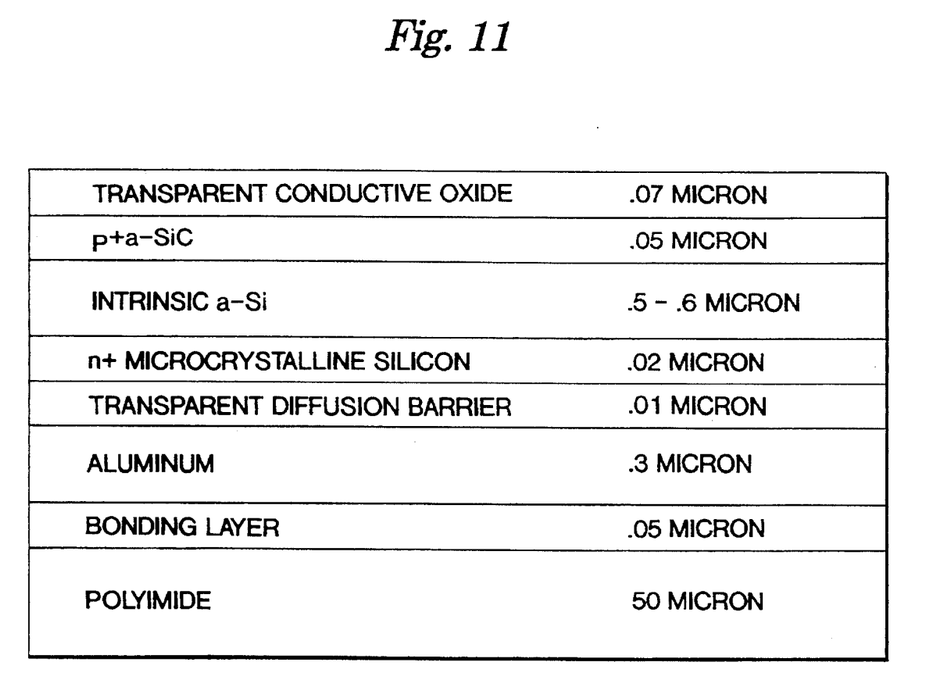
FIG. 11 is a schematic representation of the cell construction of the photovoltaic cells shown in FIG. 10.

The cell power output can then be found from a characteristic curve for that cell. FIG. 10 shows the results of this determination indicating the incident intensity of the preferred embodiment of the present invention. The result for the cell shown in FIGS. 7–10 had a relatively thick i-layer in order to absorb the longer wavelengths in that spectrum. Further enhancement in efficiency may be achieved by reducing the cell i-layer thickness to a value more appropriate for the wavelengths of the preferred embodiment (615 nm). FIG. 11 shows the construction of such a cell for the 615 nm spectrum. The layer thickness in this cell which would provide the best efficiency for the 615 nm spectrum can be determined by experiment using the criteria just outlined. The applicant estimates that, when properly optimized, this cell should proved for a 12% or higher quantum efficiency.

Although the preferred embodiment of the photocell means 16 is described in terms of the photovoltaic cells 62, it will be recognized that a variety of photovoltaic and photoconductive devices are contemplated for use with the present invention. For example, the photocell means 16 might be comprised of a semiconductor avalanche photodiode or phototransistor; or the photocell means 16 might be made of a metal-semiconductor type photocell or a Schottky-barrier type photocell. As will be appreciated by one skilled in the art, the selection of the type of photocell means 16 will depend upon numerous factors, including: the band gap energy, the material selected, the construction techniques, the desired efficiency. For a more detailed discussion of these considerations reference is made to J. Wilson and J. Hawkes, *Optoelectronics: An Introduction*, pgs. 286–327, Prentice Hall (1983).

One of the more interesting alternative embodiments of the present invention involves the use of a phototransistor for the photocell means 16. In addition to the gain introduced by the optical control means 14, the phototransistor can provide an additional gain for the optoelectronic active circuit element 10. The net effect is a cascaded two-stage gain device that greatly increase the magnitude of the gain swing of the active circuit element.

Equivalent Circuit

Figure 3:
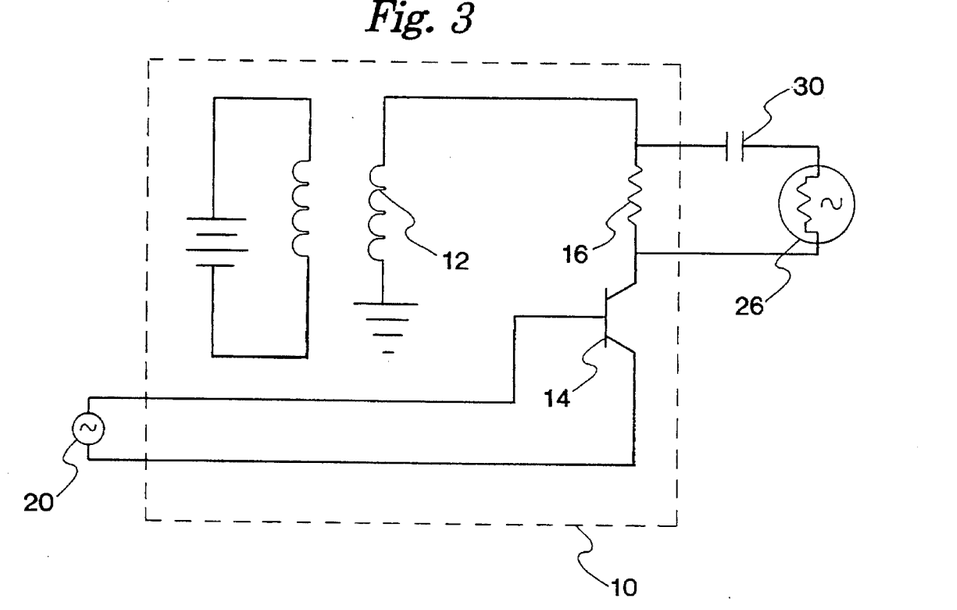
FIG. 3 is a schematic view of an equivalent circuit for the preferred embodiment of the present invention.

Referring now to FIG. 3, the equivalent circuit for the optoelectronic active circuit element 10 will be described. The light source means 12 is shown as a voltage source and a transformer for isolating the energy source from the remaining portions of the equivalent circuit. The optical control means 14 acts as a transistor with the base current being supplied by the input voltage $V_{input}$ 20. The photocell means 16 is shown as its series resistance value connected to the emitter of the transistor with the output voltage $V_{output}$ 26 being measured across this resistance. In the equivalent circuit as shown, an external capacitor 30 is used to decouple the D.C. components of the output voltage $V_{output}$ 26.

In general, the characteristic function of the optoelectronic active circuit element 10 is driven by the change in the refractive index of the optical control means 14 and the corresponding change in intensity, frequency or both of the photon energy incident upon the optical control means 14. The change in the index of refraction of a photorefractive material may be expressed in terms of the applied electric field as:

$$1/\Delta n^2 = r\epsilon + P\epsilon^2$$

where r is the linear electro-optic coefficient and P is the quadratic electro-optic coefficient. In solids, the linear variation in the refractive index is known as the Pockels effect and the non-linear variations in the refractive index is referred to as the Kerr effect. For a more detailed discussion of the implications of the Pockel and Kerr effects on the index of refraction of a photorefractive material, reference is made to J. Wilson and J. Hawkes, *Optoelectronics: An Introduction*, pgs. 85–124, Prentice Hall (1983).

It will be appreciated that the characteristic function of any particular embodiment of the present invention will be a complex function dependent ultimately upon the atomic level interaction of the photons and electrons within the photorefractive material, as well as the optical relationships among each of the component materials of the optoelectronic active circuit element 10. Although the applicant has not provided a representative example of the various types of characteristic functions of the optoelectronic active circuit element of the present invention, it is believed that the characteristic function of the device will include, at least, a linear region, an active region and a saturation or cutoff region. The precise nature of the characteristic equation will depend upon the particular materials chosen for the device and the manner in which these material are fabricated, the mathematical representation of which is beyond the scope of the present application.

Although the optoelectronic active circuit element of the present invention has been described in terms of an active circuit element, it will be recognized by one skilled in the art that the circuit element of the present invention is capable of emulating many types of active circuit elements such as a transistor/switch, a transistor/amplifier, a diode/rectifier, a diode/detector, and a Schmidt trigger, as well as numerous types of logic elements such as AND gates, OR gates, inverters, and memory cells.

Optical Control Means

The optical control means 14 of the preferred embodiment is comprised of a photorefractive material that modulates the light incident upon the surface of the optical control means adjacent the light emitting surface of the light source means 12. When an electrical field is applied across a photorefractive medium, the distribution of electrons within the medium is distorted so that the polarizability and hence the refractive index of the medium changes anisotropically. In the present invention, the electrical field is applied in the form of an input voltage or an input signal to the optical control means 14. As will be appreciated by one skilled in the art, the physical application of the electrical signal to the photorefractive medium (i.e., which surfaces are the electrical contacts applied to and the thickness of the dimension across which the electric field will propagate) will effect the photorefractive effect obtained from the medium.

In the preferred embodiment, a high impedance device is used to drive the input signal to modulate optical control means 14, thereby decreasing the switching capacitance and the switching time of the optical control means 14. In the preferred embodiment, a small PLZT optical control means having dimensions of approximately 0.05"×0.05" will have a capacitance in the 10 pF range. This device would be capable of switching speeds on the order of 400 MHz for input signals of 5 volts. The normal index of refraction of PLZT is on the order of 2.5. The index of refraction of thin film PLZT 280-100 is 2.6. These indices of refraction are desirable in that the typical index of refraction of the preferred polymer light source is in the range of 1.5 and the typical index of refraction of the preferred amorphous silicon photocell is in the range of 3.5. For a typical PLZT material, the photorefractive capabilities of the material are such that it can modulate 65% of the photon energy transmitted through the material in response to relatively low electrical fields. The switching speeds of the PLZT are also very fast, with modulation capabilities on the order of 10–20 GHz.

Figure 4A:
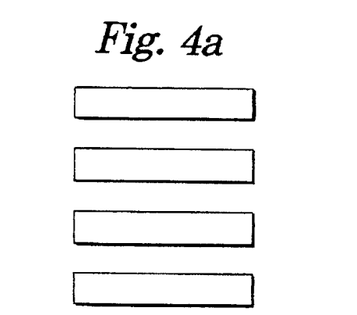
FIG. 4 is a frequency plot of an interference bandpass filter embodiment of the present invention.
Figure 4B:
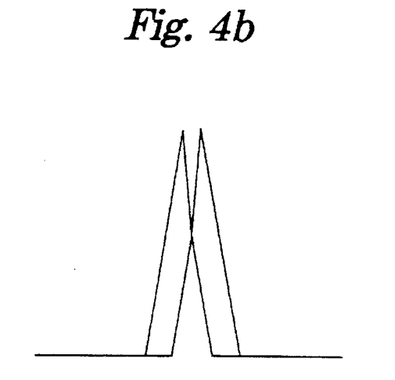
Figure 4C:
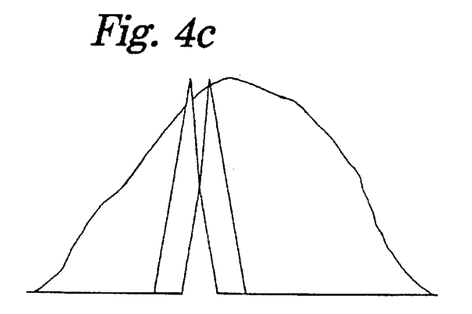

Referring now to FIG. 4, a frequency plot of the frequency distribution of a frequency modulated embodiment of the present invention is shown. This plot demonstrates how the index of refraction of the optical control means 14 of the present invention could be used to alter the frequency of the transmitted light. Assuming that the photocell means 16 is responsive only to the narrow frequency band 50, the change in the frequency of the light passing through the optical control means 14 will produce a corresponding change in the voltage output of the photocell means 16. In this embodiment, the optical control means 14 is comprised of an interference filter 52 in combination with a photorefractive material 54. The interference filter means 52 polarizes the incident photon energy such that relatively small changes in the index of refraction of the photorefractive material 54 allow the optical control means 14 to function as a frequency bandpass filter. The interference filter means 52 may be any type of well-known polarizing filter, including an interdigitated grid. The PLZT material of the preferred embodiment may be capable of frequency modulation down to as fine a resolution as 2 nm wavelengths.

Although the photorefractive material that comprises the optical control means 14 of the preferred embodiment is shown as being responsive to an electrical signal, it will also be recognized that other types of input signals may be used to activate a change in the index of refraction of certain types of photorefractive materials. For example, certain photorefractive materials may operate as magneto-optical devices, responding to a Farrady magnetic effect. Other types of photorefractive materials may be sensitive to pressure or to acoustical signals. Still other types of photorefractive materials may be sensitive to temperature variations. As a result, the present invention has numerous applications as a sensing device and, in particular, a self-powered sensing device that is capable of amplifying the sensed condition to enable easier detection.

Optical Mating Materials

Because the characteristic function of the optoelectronic active circuit element 10 is dependent upon the index of refraction of the optical control means 14, the optical mating of the light source means 12, the photocell means 16 and the optical control means 14 is an important consideration in both the efficiency of the device, as well as the characteristic function exhibited by the device. Although it would be possible to factor multiple changes in the indices of refraction of the various components into the characteristic function of the device, it is preferable to minimize the impact of any changes introduced into the device by changes in the indices of refraction of all materials other than the photorefractive material. To accomplish this, the preferred embodiment can include a first optical mating means optically interposed between the light emitting surface of the light source means 12 and the optical control means 14 and a second optical mating means optically interposed between the optical control means 14 and the light collecting surface of the photocell means 16. The purpose of the optical mating means is to maximize the transmisivity of the emitted light energy by minimizing the boundary condition reflections among the various materials.

In the preferred embodiment, the first and second optical mating means are comprised of an optical gel, such as Rheogel 210C or Dow Corning Optical Fluid. The first optical gel should have an index of refraction equal to the square root of the product of the index of refraction of the light source means 12 and the index of refraction of the optical control means 14. The second optical gel should have an index of refraction to the square root of the product of the index of refraction of the optical control means 14 and the index of refraction of the photocell means 16. As an alternative to the use of a separate optical mating means, a first and second sputtering material may also be used. The first sputtering material should have an index of refraction equal to the square root of the product of the index of refraction of the light source means 12 and the index of refraction of the optical control means 14 and the second sputtering material should have an index of refraction to the square root of the product of the index of refraction of the optical control means 14 and the index of refraction of the photocell means 16. Another variation on the sputtering material is to define a sputtering region having a defined sputtering depth in the deposited material that comprise the light source means 12, the optical control means 14 or the photocell means 16 that will produce an equivalent effect as an optical mating means.

Maximum absorption of the emitted light energy from the light source means is achieved by the intimate optical contact between the light emitting surface of the light source means and the light collecting surface of the photocell means, by matching the maximum absorption frequency bandwidth of the photovoltaic cell with the specified frequency bandwidth of the emitted light energy from the light emitting polymer material, and by the structural arrangement of the light emitting polymer material itself. To maximize the surface area between the light emitting polymer and the photovoltaic cell, the light emitting surface and the light collecting surface are preferably arranged so that they are generally parallel to and in intimate contact with each other. In addition, the light emitting polymer material and the photovoltaic cell may be arranged to allow the photovoltaic cell to be constructed in manner so as to absorb light energy at more than a single surface.

Another feature that may be used to increase the efficiency of the present invention is to include a focal means optically interposed between the light emitting surface of the light source means 12 and the light collecting surface of the photocell means 16 for focusing the emitted light energy on the photocell means 16. The focal means may be interposed either prior to, or after, the optical control means 14.

Example Applications

Figure 5A:
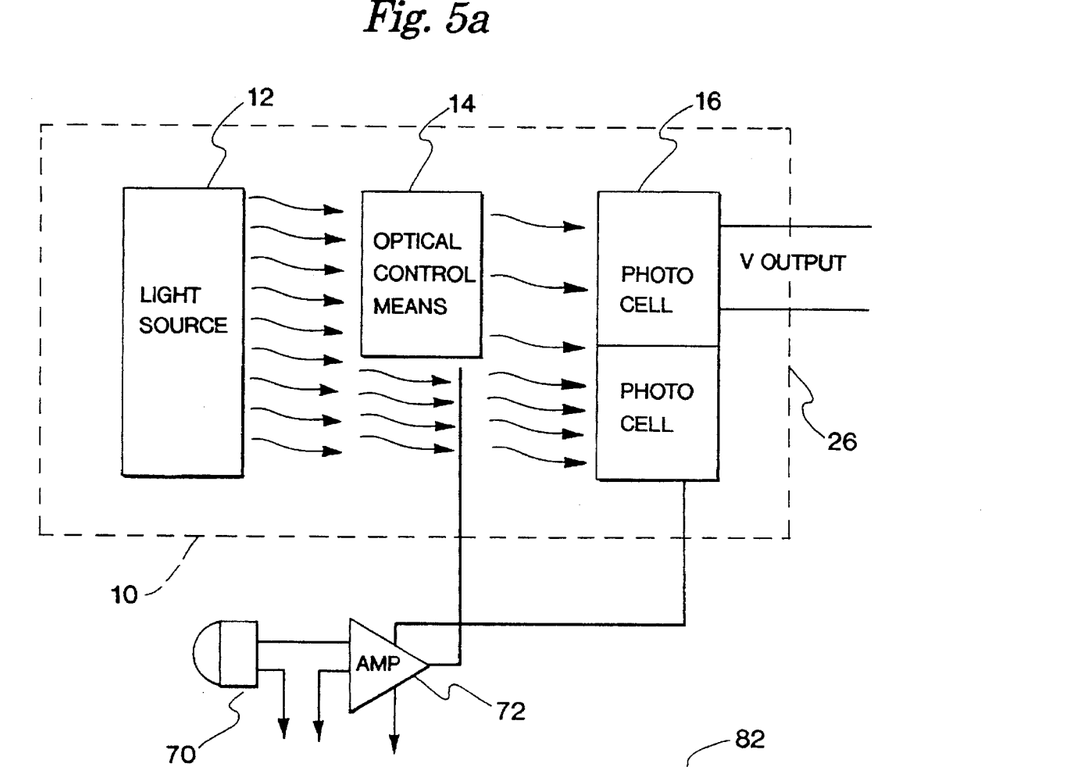
FIGS. 5a and 5b are schematic views of a microphone amplifier and an oscillator logic element incorporating the present invention.
Figure 5B:
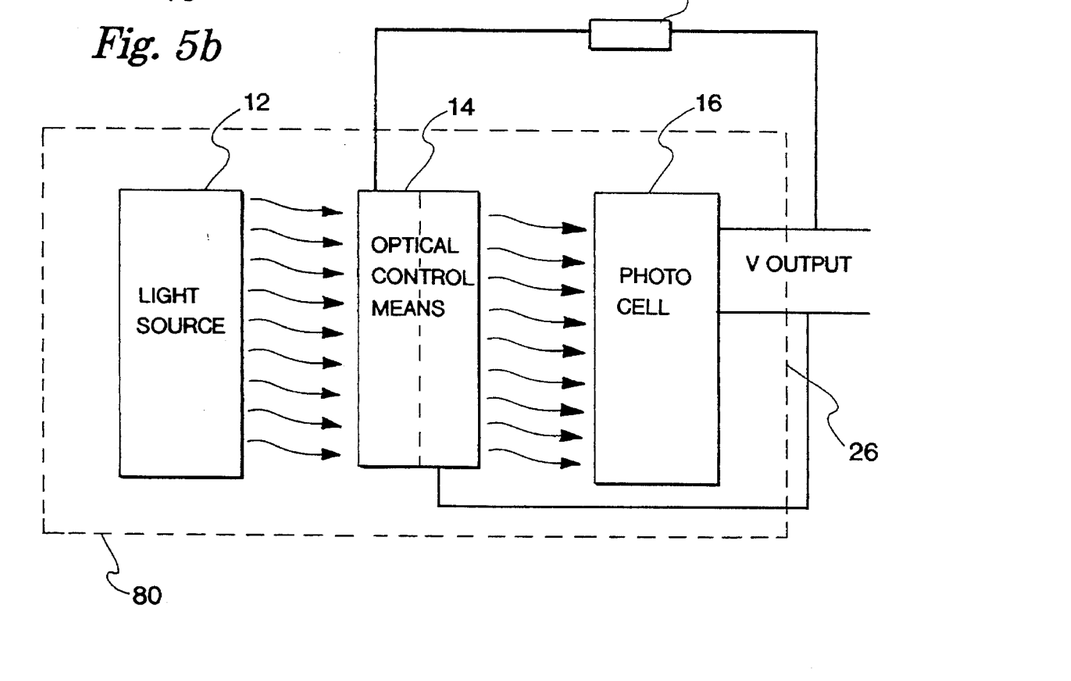

Referring now to FIGS. 5a and 5b, two sample applications of the optoelectronic active circuit element of the present invention are shown. In FIG. 5a, the optoelectronic active circuit element 10 is used as both an amplifier and power source for the microphone 70 and voltage amplifier 72 of a sound detection device, the output of which may be fed to a transmitter logic, for example. In FIG. 5b, a frequency feedback control 82 is used in conjunction with a frequency modulated optical control means 14 to produce an oscillator 80 having a sinusoidal output signal.

Although the description of the preferred embodiment has been presented, it is contemplated that various changes could be made without deviating from the spirit of the present invention. Accordingly, it is intended that the scope of the present invention be dictated by the appended claims rather than by the description of the preferred embodiment.

I claim:

1. An optoelectronic device comprising:

a light source means having at least one light emitting surface for emitting light energy in a specified frequency bandwidth;

a photocell means having a light collecting surface for absorbing light energy and converting the light energy into an electrical output signal; and optical control means comprising a generally planar sheet of photorefractive material that is a liquid crystal display material having at least a first and second surface, the first surface being in intimate contact with the light emitting surface of the light source means and the second surface being in intimate contact with the light collecting surface of the photocell means for transmitting and directly modulating the amount of emitted light energy that may be absorbed by the photocell means in response to an input signal by receiving the emitted light incident upon the first surface, modulating the emitted light within the photorefractive material in response to the input signal and emitting a modulated light energy from the second surface to be absorbed by the photocell means, such that the optoelectronic device behaves as an active circuit element where the electrical output signal is a function of the input signal.

2. An optoelectronic device comprising:

a light source means having at least one light emitting surface for emitting light energy in a specified frequency bandwidth;

a photocell means having a light collecting surface for absorbing light energy and converting the light energy into an electrical output signal; and optical control means comprising a generally planar sheet of photorefractive material that is a lead lantium zirconium titinate material having at least a first and second surface, the first surface being in intimate contact with the light emitting surface of the light source means and the second surface being in intimate contact with the light collecting surface of the photocell means for transmitting and directly modulating the amount of emitted light energy that may be absorbed by the photocell means in response to an input signal by receiving the emitted light incident upon the first surface, modulating the emitted light within the photorefractive material in response to the input signal and emitting a modulated light energy from the second surface to be absorbed by the photocell means, such that the optoelectronic device behaves as an active circuit element where the electrical output signal is a function of the input signal.

3. An optoelectronic device comprising:

a light source means that is a light emitting polymer material having at least one light emitting surface for emitting light energy in a specified frequency bandwidth;

a photocell means having a light collecting surface for absorbing light energy and converting the light energy into an electrical output signal; and optical control means comprising a generally planar sheet of photorefractive material having at least a first and second surface, the first surface being in intimate contact with the light emitting surface of the light source means and the second surface being in intimate contact with the light collecting surface of the photocell means for transmitting and directly modulating the amount of emitted light energy that may be absorbed by the photocell means in response to an input signal by receiving the emitted light incident upon the first surface, modulating the emitted light within the photorefractive material in response to the input signal and emitting a modulated light energy from the second surface to be absorbed by the photocell means, such that the optoelectronic device behaves as an active circuit element where the electrical output signal is a function of the input signal.

4. The optoelectronic device of claim 3 wherein the light emitting polymer material comprises an organize polymer incorporating a radioisotope emitting betas to which an organic phosphor is bonded, wherein the radioisotope consists of a radioisotope selected from the group $^3$H, $^{10}$Be, $^{14}$C, $^{32}$Si and $^{32}$P.

5. The optoelectronic device of claim 3 wherein the light emitting polymer material is comprised of a tritiated organic polymer to which an organic phosphor is bonded.

6. An optoelectronic device comprising:

a light source means having at least one light emitting surface for emitting light energy in a specified frequency bandwidth that is substantially monochromatic;

a photocell means having a light collecting surface for absorbing light energy and converting the light energy into an electrical output signal; and optical control means comprising a generally planar sheet of photorefractive material having at least a first and second surface, the first surface being in intimate contact with the light emitting surface of the light source means and the second surface being in intimate contact with the light collecting surface of the photocell means for transmitting and directly modulating the amount of emitted light energy that may be absorbed by the photocell means in response to an input signal by receiving the emitted light incident upon the first surface, modulating the emitted light within the photorefractive material in response to the input signal and emitting a modulated light energy from the second surface to be absorbed by the photocell means, such that the optoelectronic device behaves as an active circuit element where the electrical output signal is a function of the input signal.

7. An optoelectronic device comprising:

a light source means having at least one light emitting surface for emitting light energy in a specified frequency bandwidth;

a photocell means having a light collecting surface for absorbing light energy and converting the light energy into an electrical output signal:

optical control means comprising a generally planar sheet of photorefractive material having at least a first and second surface, the first surface being in intimate contact with the light emitting surface of the light source means and the second surface being in intimate contact with the light collecting surface of the photocell means for transmitting and directly modulating the amount of emitted light energy that may be absorbed by the photocell means in response to an input signal by receiving the emitted light incident upon the first surface, modulating the emitted light within the photorefractive material in response to the input signal and emitting a modulated light energy from the second surface to be absorbed by the photocell means; and focal means optically interposed between the light emitting surface of the light source means and the light collecting surface of the photocell means for focusing the emitted light energy on the photocell means, such that the optotelectronic device behaves as an active circuit element where the electrical output signal is a function of the input signal.

8. An optoelectronic device comprising:

a light source means having at least one light emitting surface for emitting light energy in a specified frequency bandwidth;

a photocell means having a light collecting surface for absorbing light energy and converting the light energy into an electrical output signal;

optical control means comprising a generally planar sheet of photorefractive material having at least a first and second surface, the first surface being in intimate contact with the light emitting surface of the light source means and the second surface being in intimate contact with the light collecting surface of the photocell means for transmitting and directly modulating the amount of emitted light energy that may be absorbed by the photocell means in response to an input signal by receiving the emitted light incident upon the first surface, modulating the emitted light within the photorefractive material in response to the input signal and emitting a modulated light energy from the second surface to be absorbed by the photocell means such that the optotelectronic device behaves as an active circuit element where the electrical output signal is a function of the input signal;

a first optical mating means optically interposed between the light emitting surface of the light source means and the optical control means; and a second optical mating means optically interposed between the optical control means and the light collecting surface of the photocell means, whereby the first and second optical mating means operate to increase the transmisivity of the emitted light energy.

9. The optoelectronic device of claim 8 wherein the first and second optical mating means are comprised of a first and second optical gel, the first optical gel having an index of refraction equal to the square root of the product of the index of refraction of the light source means and the index of refraction of the optical control means and the second optical gel having an index of refraction to the square root of the product of the index of refraction of the optical control means and the index of refraction of the photocell means.

10. The optoelectronic device of claim 8 wherein the first and second optical mating means are comprised of a first and second sputtering material, the first sputtering material having an index of refraction equal to the square root of the product of the index of refraction of the light source means and the index of refraction of the optical control means and the second sputtering material having an index of refraction to the square root of the product of the index of refraction of the optical control means and the index of refraction of the photocell means.

11. The optoelectronic device of claim 8 wherein the first and second optical mating means are comprised of a first and second sputtering region, the first sputtering region defining a sputtering depth wherein the optical control means is sputtered into the light emitting surface of the light source means and the second sputtering defining a sputtering depth wherein the optical control means is sputtered into the light absorbing surface of the photocell means.

12. An optoelectronic device comprising:

a light source means having at least one light emitting surface for emitting light energy in a specified frequency bandwidth;

a photocell means having a light collecting surface for absorbing light energy and converting the light energy into an electrical output signal;

optical control means comprising a generally planar sheet of photorefractive material having at least a first and second surface, the first surface being in intimate contact with the light emitting surface of the light source means and the second surface being in intimate contact with the light collecting surface of the photocell means for transmitting and directly modulating the amount of emitted light energy that may be absorbed by the photocell means in response to an input signal by receiving the emitted light incident upon the first surface, modulating the emitted light within the photorefractive material in response to the input signal and emitting a modulated light energy from the second surface to be absorbed by the photocell means, such that the optotelectronic device behaves as an active circuit element where the electrical output signal is a function of the input signal and such that the optoelectronic device operates at frequencies greater than 1 megahertz and has a functional capacitance of less than 1 microfarad.

13. An optoelectronic device comprising:

emitter means for providing photon energy;

collector means for receiving photon energy from the emitter means and converting the photon energy to an electrical energy signal; and optical control means comprised of a generally planar sheet of photorefractive material having at least a first and second surface interposed between and in intimate contact with the emitter means and the collector means for transmitting and directly modulating the amount of photon energy from the emitter means to the collector means in response to an electrical input signal by receiving the photon energy incident upon the first surface, modulating the photon energy within the photorefractive material in response to the electrical input signal and emitting a modulated photon energy from the second surface to be absorbed by the collector means, such that the electrical energy signal is a function of the electrical input signal.

14. The optoelectronic active circuit element of claim 13 wherein the photorefractive material is a liquid crystal display material.

15. The optoelectronic active circuit element of claim 13 wherein the photorefractive material is a lead lantium zirconium titinate material.

* * * * *